(12) United States Patent
Dawkins

(10) Patent No.: US 10,588,240 B1
(45) Date of Patent: Mar. 10, 2020

(54) AIR COOLING SYSTEM FOR MODULAR ELECTRONIC EQUIPMENT

(71) Applicant: Pacific Star Communications, Inc., Portland, OR (US)

(72) Inventor: Dalton Dawkins, Portland, OR (US)

(73) Assignee: Pacific Star Communications, Inc., Portland, OR (US)

( * ) Notice: Subject to any disclaimer, the term of this patent is extended or adjusted under 35 U.S.C. 154(b) by 0 days.

(21) Appl. No.: 16/387,330

(22) Filed: Apr. 17, 2019

(51) Int. Cl.
 *H05K 7/20* (2006.01)
 *G06F 1/16* (2006.01)

(52) U.S. Cl.
 CPC ....... *H05K 7/20145* (2013.01); *G06F 1/1632* (2013.01); *H05K 7/20154* (2013.01); *H05K 7/20209* (2013.01)

(58) Field of Classification Search
 CPC ........... H05K 7/20145; H05K 7/20154; H05K 7/20209; G06F 1/1632
 See application file for complete search history.

(56) References Cited

U.S. PATENT DOCUMENTS

| | | | | |
|---|---|---|---|---|
| 2008/0239688 A1* | 10/2008 | Casey | ............... | H05K 7/20563 361/796 |
| 2008/0253076 A1* | 10/2008 | Chen | ...................... | G06F 1/186 361/679.31 |
| 2008/0285221 A1* | 11/2008 | Imsand | ................... | G06F 1/183 361/679.55 |
| 2009/0016019 A1* | 1/2009 | Bandholz | ................. | G06F 1/20 361/695 |
| 2009/0152216 A1* | 6/2009 | Champion | .............. | G06F 1/183 211/26 |
| 2009/0262501 A1* | 10/2009 | Claassen | ................... | G06F 1/20 361/701 |
| 2010/0008038 A1* | 1/2010 | Coglitore | ................ | G06F 1/187 361/679.48 |
| 2010/0103618 A1* | 4/2010 | Campbell | .......... | H05K 7/20236 361/699 |
| 2012/0050986 A1* | 3/2012 | Riebel | .................. | H05K 7/1488 361/679.48 |
| 2014/0040524 A1* | 2/2014 | Luck | ....................... | G06F 1/181 710/306 |
| 2014/0104785 A1* | 4/2014 | Wu | ........................... | G06F 1/20 361/679.48 |
| 2014/0167511 A1* | 6/2014 | Tian | ......................... | H02J 1/06 307/41 |
| 2014/0321056 A1* | 10/2014 | Yoshikawa | ........ | H05K 7/20818 361/697 |
| 2016/0165742 A1* | 6/2016 | Shen | .................... | H05K 7/1487 361/679.37 |

(Continued)

*Primary Examiner* — Jayprakash N Gandhi
*Assistant Examiner* — Michael A Matey
(74) *Attorney, Agent, or Firm* — Perkins Coie LLP

(57) ABSTRACT

A system for providing cooling to electronic modules received within a chassis. The chassis includes a cooling apparatus having ducting and a plurality of fans coupled to the ducting. The ducting includes air passageways that extend through the ducting and are configured to direct air blown into the passageways by the fans toward the modules installed in the chassis. The modules include heat sinks and the air passageways direct the air toward the fins to provide cooling to the heat sinks. The chassis includes switches coupled to the fans and configured to selectively activate the individual fans when the electronic modules are installed in the chassis.

17 Claims, 7 Drawing Sheets

(56) References Cited

U.S. PATENT DOCUMENTS

| | | | |
|---|---|---|---|
| 2017/0013742 A1* | 1/2017 | Oota | H05K 7/20145 |
| 2017/0027073 A1* | 1/2017 | Zani | G06F 1/185 |
| 2019/0116689 A1* | 4/2019 | Chen | H05K 7/20154 |
| 2019/0133000 A1* | 5/2019 | Saido | H05K 7/20972 |
| 2019/0219061 A1* | 7/2019 | Tseng | F04D 25/06 |

* cited by examiner

AIR COOLING SYSTEM FOR MODULAR ELECTRONIC EQUIPMENT

TECHNICAL FIELD

The present technology is related to systems and methods for cooling modular electronic components.

BACKGROUND

There are many environments without a surrounding communications/data infrastructure required to support communications and information services equipment, such as equipment used to access a network, transmit or encrypt network traffic, host (run) software applications, store digital data or connect and conduct phone calls or video teleconferencing. It is often desirable to build the electronic equipment using off-the-shelf electronic components for simplicity and to keep production and maintenance costs low. Development and operating costs can be reduced or eliminated by integrating existing computer components, power supply modules, and/or telecommunication components in an electronic system. A potential drawback with using off-the-shelf components is that they may not be well suited for use in harsh operating environments, including elevated ambient operating temperatures.

The maximum rated operating internal temperature of the module is often a function of the amount of heat produced by the various electronic components inside the module during operation, the maximum operating core temperature limits of those components, and the amount of heat expected to be removed from the module during operation at the maximum rated operating ambient air temperature (e.g., the amount of heat expected to be removed by a built-in cooling fan inside the module). For example, if the ambient air temperature rises above the maximum rated operating ambient temperature for the module, at least one of the electronic components inside the module is likely to reach a core temperature above the maximum operating temperature for the corresponding electronic component(s). In some cases, this elevated temperature can reduce the operating life of the module or cause the module to fail. Even if the individual maximum operating core temperature limits of the electronic components inside the module are high, the maximum ambient internal operating temperature of the module may be fairly low, because only a small amount of heat is expected to be removed from the module during operation. Accordingly, there is a need for an improved system for cooling electronic modules.

DETAILED DESCRIPTION

The present technology is directed to an air-cooling system for modular electronic equipment coupled to a chassis. The air-cooling system includes a duct assembly positioned within the chassis and used to direct cooling air flow toward the electronic modules using high-velocity fans. The fans are mounted and aligned with air passageways extending through the duct assembly. The air passageways can include vanes that selectively direct the air out of the air passageways and toward one or more docking stations in the chassis into which the electronic modules are removably installed. The modules include heatsinks configured to expel heat emitted by the electronic components within the individual modules. The vanes that help to define the air passageways are positioned to direct the air flow from the high velocity fans so that it flows over at least portions of the exterior surface of the docked electronic modules, including over the heat sinks, to efficiently and effectively remove heat from the modules. The chassis includes fan switches operatively coupled to the high-velocity fans and positioned to be activated when a module is inserted into a corresponding docking station. The fan switch is disengaged when the module is removed from the docking station. Specific details of the present technology are described herein with reference to FIGS. 1-6.

Although many of the embodiments are described with respect to communication systems, it should be noted that other applications and embodiments in addition to those disclosed herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

Figure 1:
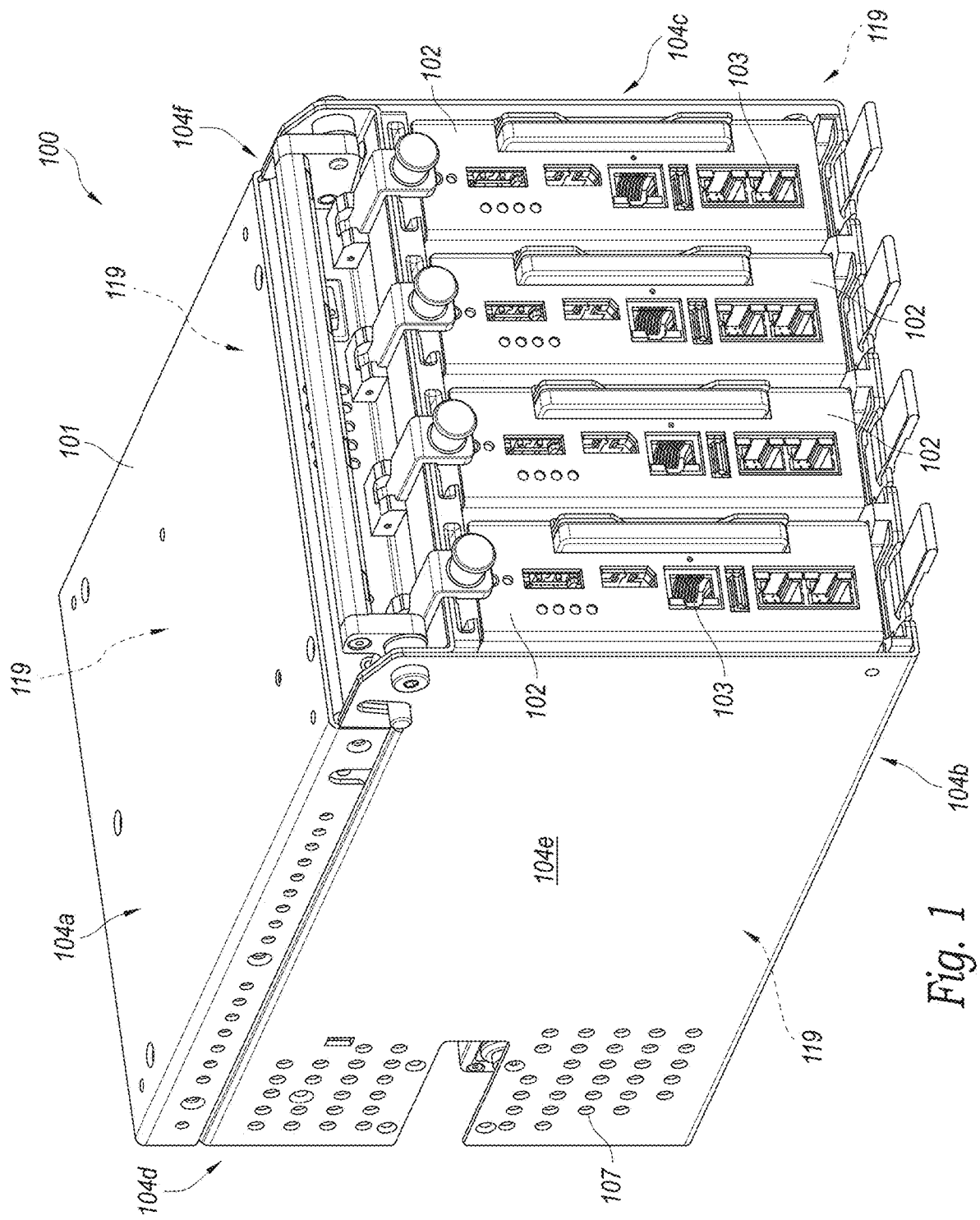
FIG. 1 is an isometric view of an electronic system that includes a plurality of modules coupled to a chassis configured in accordance with embodiments of the present technology.

FIG. 1 is an enlarged isometric view of an electronic system 100 in accordance with embodiments of the present technology. In some embodiments, the electronic system 100 can include networking equipment for use with communications and/or computing systems. The electronic system 100 includes a chassis 101 configured to receive one or more modules 102. In some embodiments, the modules 102 can be modules, such as off-the-shelf modules, configured for communications, computing, data storage, encryption, networking, and/or other electronic modules, such as the PacStar 400-Series or 500-Series modules from Pacific Star Communications (https://pacstar.com/, and https://pacstar.com/products/deployable-communications/). The chassis 101 includes a plurality of docking stations 119 that can each removably receive one of the modules 102, so that the installed modules 102 can be operatively interconnected within a compact, size-efficient, and transportable unit. The chassis 101 can provide power to the installed modules 102.

The modules 102 can be configured to communicate with each other and with one or more computing devices via a wired and/or wireless connection (e.g., providing a local-area network). The computing devices can include personal computers, hand-held or laptop devices, multiprocessor systems, microprocessor-based systems, programmable consumer electronics, digital cameras, network PCs, minicomputers, cell phones, personal digital assistants, smart phones, servers, network switches, routers, and so on. The modules 103 can include input/output (I/O) ports 103 that allow the individual modules 103 to operatively connect to the computing devices.

The chassis 101 of the illustrated embodiment has a compact and generally rectangular shape defined by top and bottom surfaces 104a and 104b, front and rear surfaces 104c and 104d, and opposing side surfaces 104e and 104f. The docking stations 119 that receive the modules 102 can be formed within the chassis 101 such that, when the modules 102 are installed within the chassis 101, the modules 102 at least partially define the front surface 104c. Further, at least some of the surfaces 104a-f can include airflow holes 107 configured to allow air to flow into and through the docking stations 119 within the chassis 101.

In the illustrated embodiment, the chassis 101 includes four docking stations 119, each of which is configured to receive a respective one of the modules 102. Accordingly, the chassis 101 is configured such that four of the modules 102 can be installed within the chassis 101. In other embodiments, the chassis 101 can include three or fewer docking stations 119, allowing the chassis 101 to receive three or fewer modules 102. In still other embodiments, the chassis 101 can include five or more docking stations 119 and, accordingly, the chassis 101 can receive five or more modules 102. In general, the chassis 101 can include any suitable number of docking stations 119 and can therefore be configured to receive any suitable number of modules 102.

Figure 2:
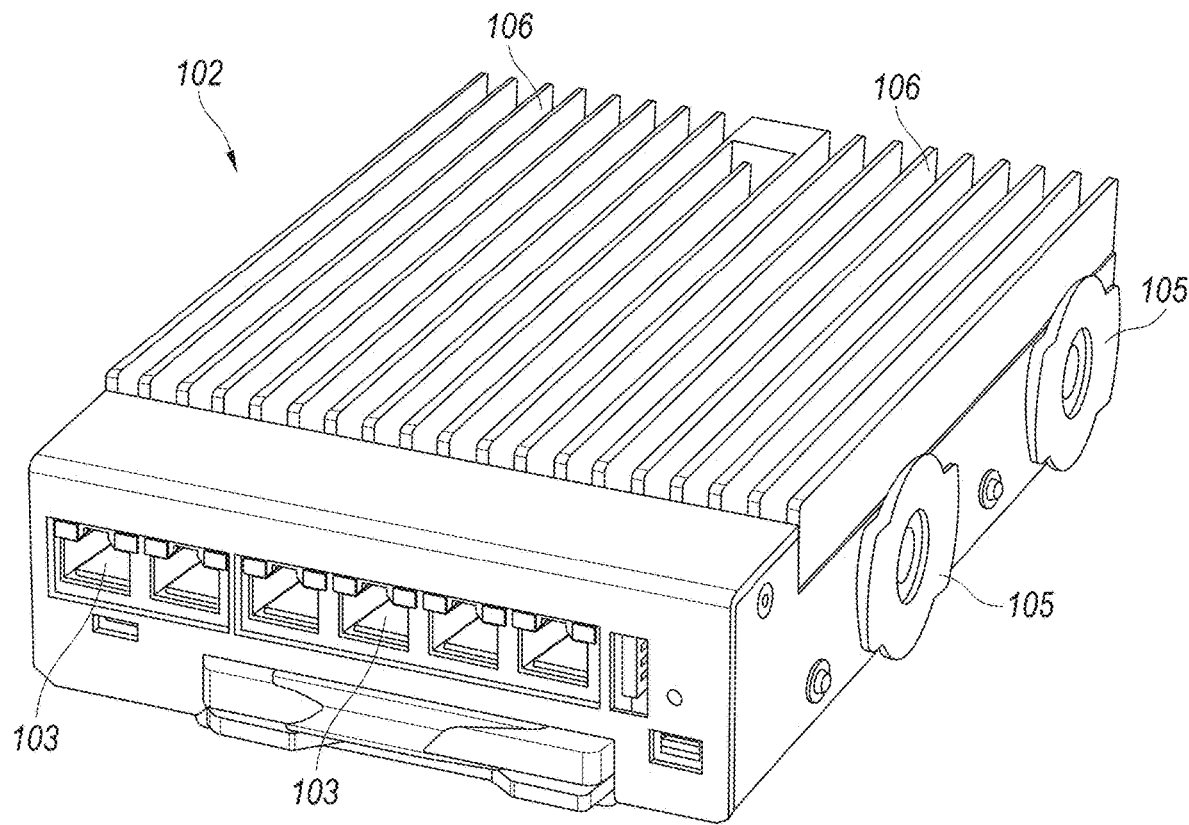
FIG. 2 is an enlarged isometric view of one of the electronic modules shown in FIG. 1.

FIG. 2 shows an isometric view of an example of one of the modules 102 that includes internal electronics that can generate significant heat during operation of the electronic system 100. The illustrated module 102 has a heat sink with a plurality of fins 106 formed on the top of the module 102 and configured to help cool the modules 102 during operation. Additionally, in some embodiments, the modules 102 can include one or more on-board fans configured to draw air in and through the electronic components within the module 102. In some embodiments, the modules 102 can also include a shroud over the fins 106 to control and direct the airflow over the fins 106, which can help to increase the amount of heat removed from the module 102. Each of the modules 102 has one or more side connectors 105 that connect with mating connectors in the selected docking station in the chassis 101 to provide power from a battery and charger assembly 108. The module's side connectors 105 in some embodiment may also can be configured to interconnect with a power source, data source, and/or other modules, as described in U.S. Pat. No. 9,225,102, which is titled "Interconnection System for Network Modules" and is incorporated by reference herein. In some embodiments, the modules 102 can have connectors on the back surface that removably mate with connectors on a connector panel affixed in the chassis 101, so as to allow the modules 102 to be quickly and easily plugged into the electronic circuitry, power, and controls carried by an embodiment of the chassis 101.

Figure 3A:
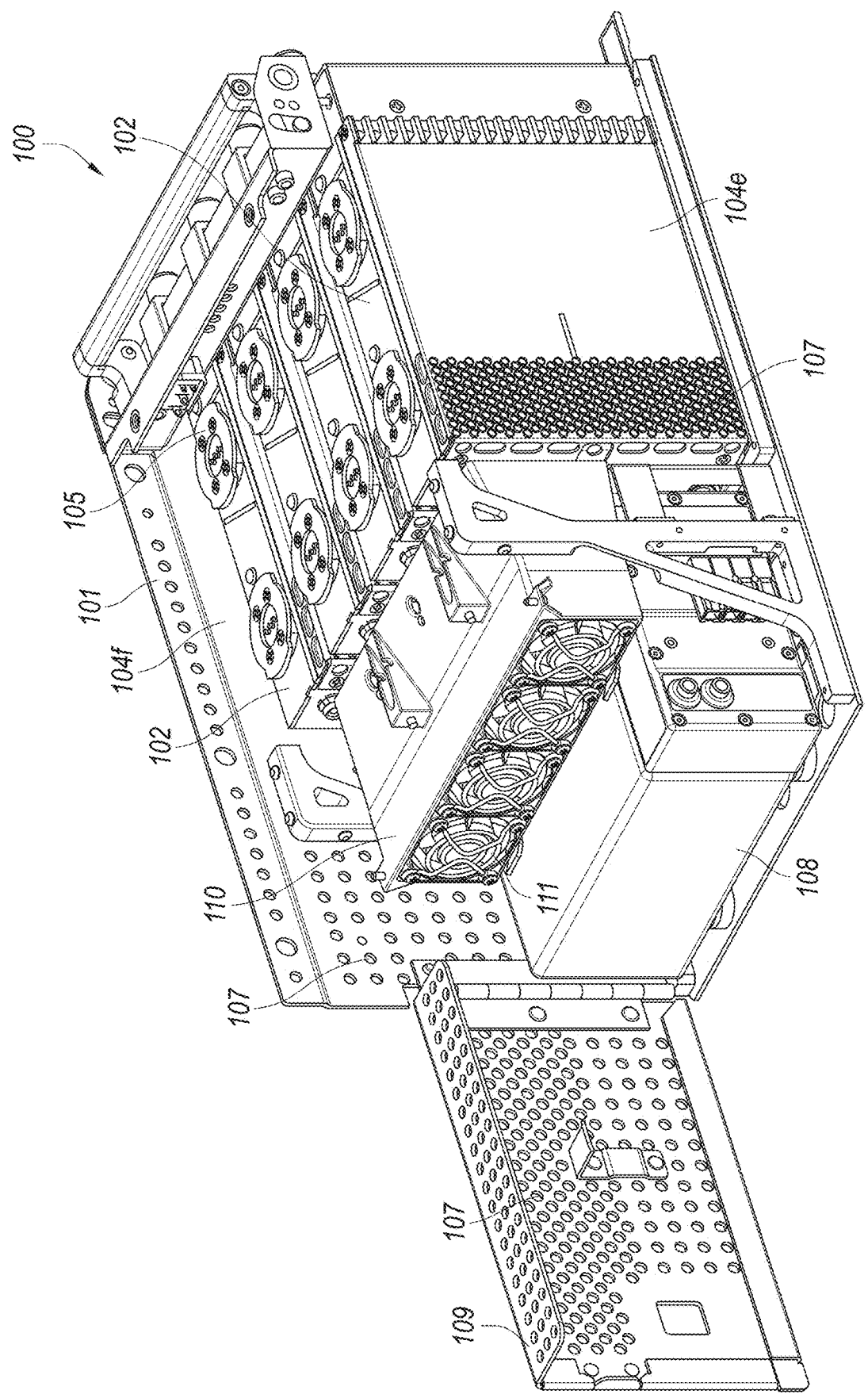
FIG. 3A is a partial rear isometric view of the electronic system of FIG. 1 with a back panel shown in an open position to illustrate a cooling system with a duct assembly in accordance with aspects of the present technology.
Figure 3B:
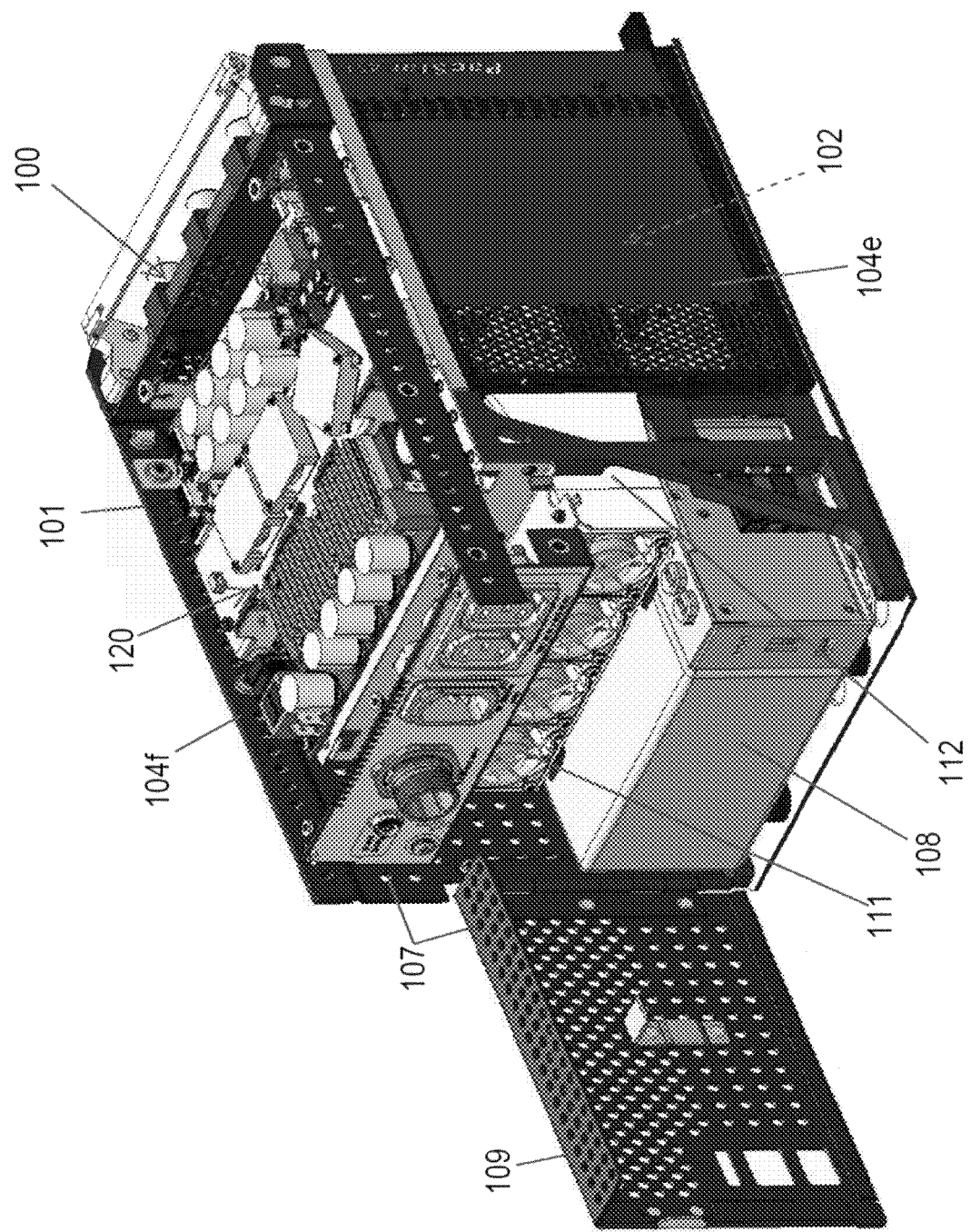
FIG. 3B is a partial rear isometric view of the electronic system of FIG. 3A with a power and control system in the top portion of the chassis above the docking stations and the installed modules.

FIG. 3A shows an enlarged, partial rear isometric view of the electronic system 100 with an access door 109 of the chassis 101 shown in an open position, and with the side surface 104e (FIG. 1) and the top surface 104a (FIG. 1) not shown so as to avoid obscuring some of the internal components of the electronic system 100. The access door 109 can be opened to allow access to the internal components of the electronic system 100. The access door 109 can also include a plurality of the airflow holes 107 that allow air to flow into and through the interior area of the chassis 101 to help cool the installed modules 102 and other components. FIG. 3B is a partial rear isometric view of the electronic system 100 of FIG. 3A with a power and control system 120 positioned in the top portion of the chassis 101 above the docking stations and the installed modules 102. The power and control system 120 is coupled to a battery with a charger 108 that can be used to power the modules 102. The power and control system 120 is also configured to the connect to an alternating current (AC) power source to power the chassis and/or the modules 102. The power and control system 120 of the illustrated embodiment includes a thermal sensor that detects the temperatures and/or other operating conditions within the chassis' interior area and in the docking stations 119. The power and control system 120, via thermal sensor, can monitor the operating conditions around the module to determine if additional cooling is needed for the modules 102.

As indicated above, each module 102 has its own on-board fan and heat sink to provide some cooling during operation. The electronic system 100 also includes a supplemental cooling assembly 110 configured to help cool the installed modules 102 using a plurality of fans 111 positioned to blow high-velocity air toward and over external surfaces of one or more docked modules 102. The supplemental cooling assembly 110 is operatively coupled to the power and control system 120, and can be activated or otherwise controlled based in part by temperature information provided by the thermal sensor. For example, the power and control system 120 can increase or decrease the operating speed of the fans 111 based upon the operating conditions detected by the thermal sensor. As the temperatures in the chassis increase, the speed of the activated fans is increased. Conversely, as the temperatures decrease, the power and control system 120 can selectively decrease the fan speed.

Figure 4A:
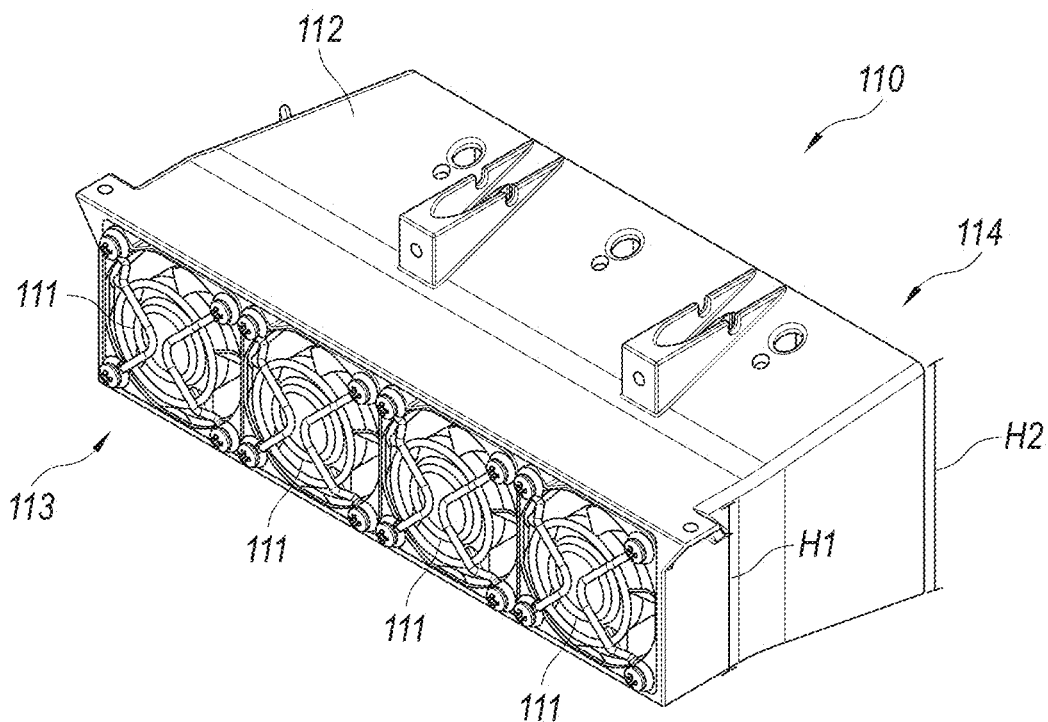
FIG. 4A is a rear isometric view of the duct assembly shown in FIG. 3.
Figure 4B:
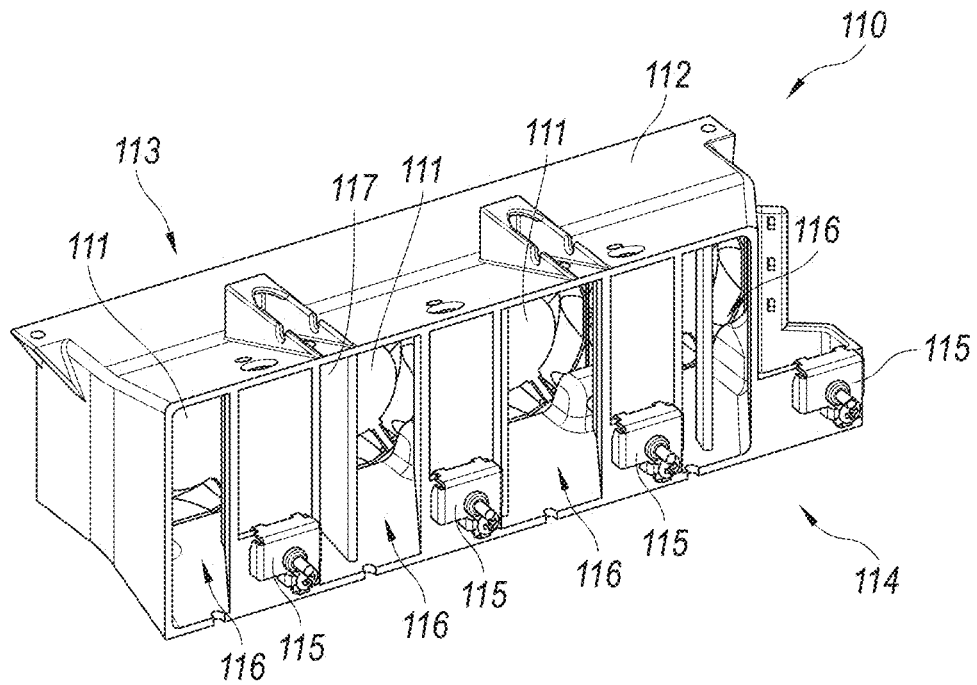
FIG. 4B is a front isometric view of the duct assembly shown in FIG. 4A.

FIGS. 4A and 4B show isometric views of the cooling assembly 110 shown removed from the chassis 101. The cooling assembly 110 includes airflow ducting 112 having an intake side 113, which is configured to be positioned near the rear surface 104d of the chassis 101, and an output side 114 aligned with the docking stations 119 and configured to be positioned near the installed modules 102. The fans 111 are mounted or otherwise coupled to intake side 113 of the ducting 112 and positioned to blow air through the ducting 112 toward the output side 114. The ducting 112 includes a plurality of air passageways 116 that extend through the ducting 112 from the intake side 113 to the output side 114 and that are at least partially defined by vanes 117. Each air passageway 116 is positioned in alignment with at least one of the fans 111, such that the high-velocity air from each fan is directed into one or more of the air passageways 116. The air passageways 116 of the illustrated embodiment are fluidly isolated from each other, such that air flowing through one of the air passageways 116 is not able to pass laterally into an adjacent air passageway 116. The vanes 117 are positioned within the ducting 112 and direct the high-velocity air through the air passageways 116 and toward the docking stations 119 containing a respective one of the modules 102. In some embodiments, the fans 111, the air passageways 116, and the vanes 117 are configured such that the high-velocity air is substantially laminar as it flows toward and/or over the modules 102 in the docking stations 119.

Figure 5:
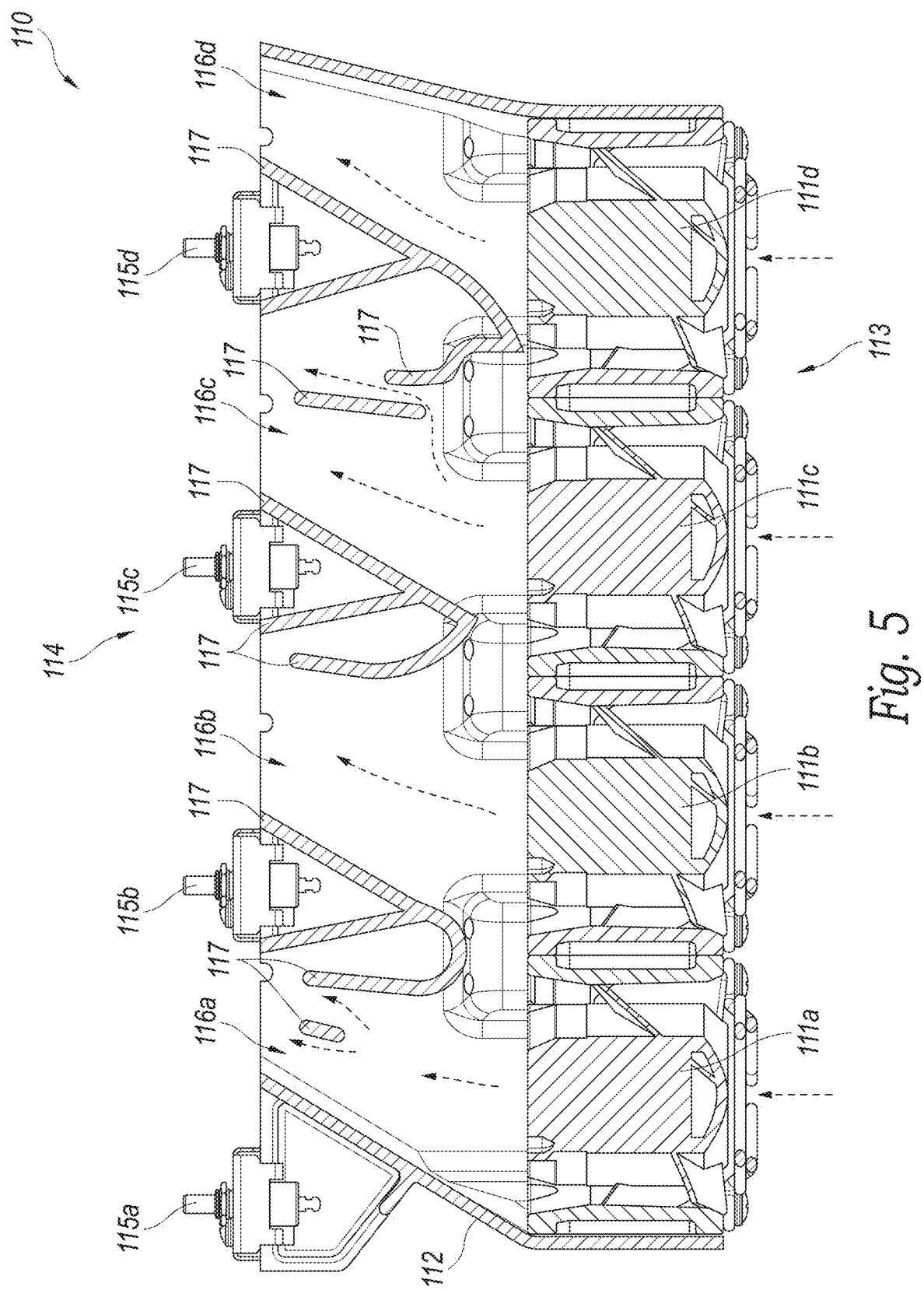
FIG. 5 is a top cross-sectional view of the duct assembly shown in FIGS. 4A and 4B.
Figure 6:
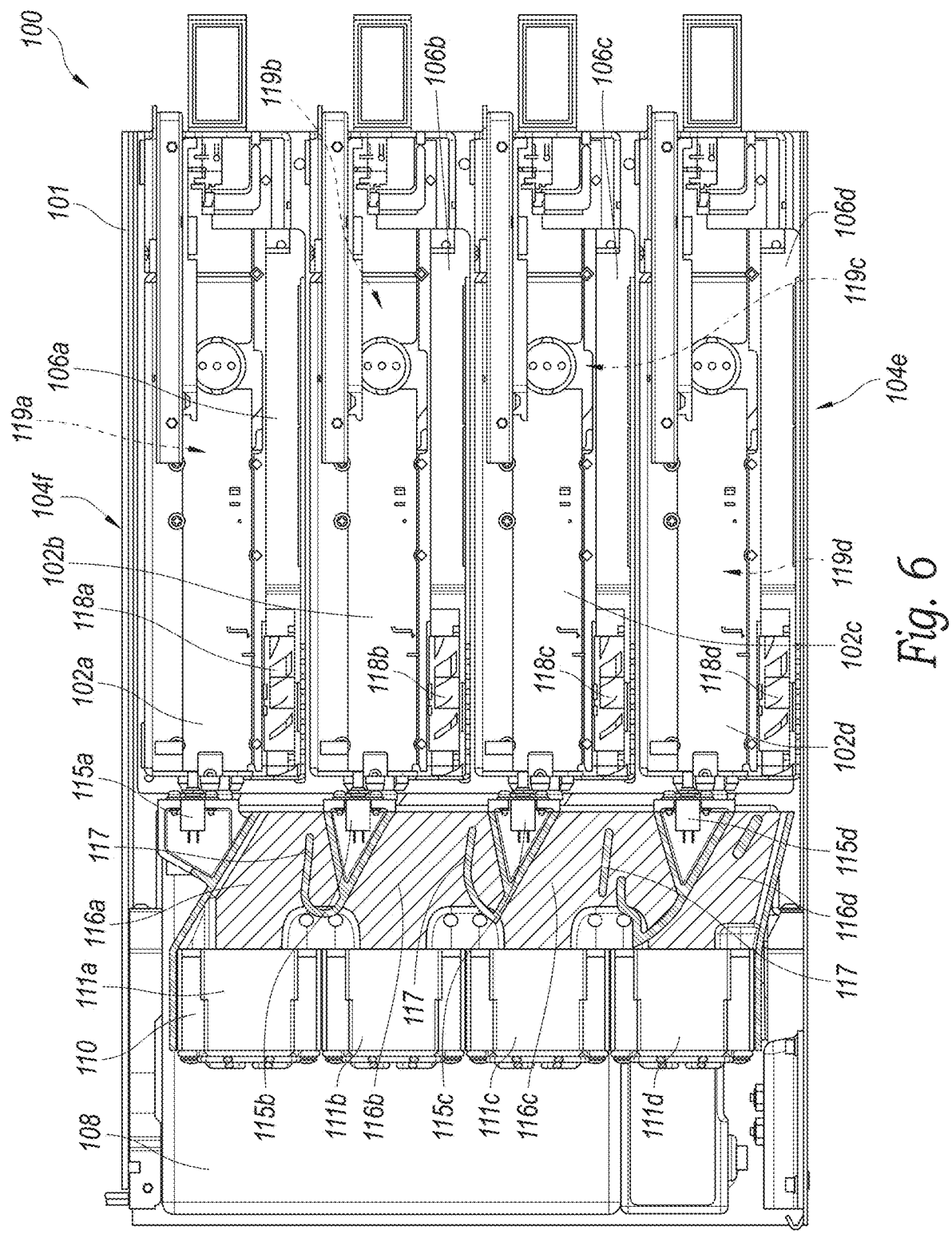
FIG. 6 is a top cross-sectional view of the electronic system of FIG. 1.

Referring to FIGS. 5 and 6, the cooling assembly 110 can also include a plurality of switches 115 positioned at the output side 114 and operatively coupled to the power and control system 120. Each of the switches 115 can be associated with a corresponding fan 111 and can be positioned within the chassis 101 near a corresponding docking station 119. In the illustrated embodiment, the switches 115 are mounted on the output side 114 of the ducting 112 and operatively connected to the control system 108. The switches 115 are positioned so that, when a module 102 is installed within one of the docking stations 119, the module 102 can engage and activate the corresponding switch 115, which enables the fan 111 aligned and associated with that docking station to be turned on and off via the control system 120. When a module 102 is removed from a docking station 119, the associated switch 115 is disengaged, thereby disabling the associated fan 111. The disabled fan 111 will not turn on even though adjacent fans associated with other docking stations 119 may be operating. In this way, the switches 115 can be used to selectively activate the individual fans 111 upon docking a module 102 in the chassis 101.

In the illustrated embodiment, the chassis 101 includes four docking stations 119a-d and is therefore configured to receive four different modules 102. Accordingly, the cooling assembly 101 includes four fans 111a-d, four air passageways 116a-d, and four switches 115a-d. When a module 102 is installed in one of the docking stations, the fan 111 aligned with the corresponding docking station 119 will be activated to blow high-velocity air through the corresponding air passageway 116. The vanes 117 that define the corresponding air passageway 116 are positioned and configured to direct the air directly into the docking station and at least over the heat sink on top of the installed module 102 and along the space in the interior area adjacent to the top of the docked module. This space adjacent to the top of one of the installed modules 102 may not be physically separated or isolated from an adjacent docking station 119, such that the high velocity air flow into one docking station 119 may pass over portions of another module 102 installed in an adjacent docking station 119.

FIG. 6 shows a top cross-sectional view of the electronic system 100 having four modules 102a-d installed within the chassis 101. Each of the modules 102a-d is installed within a corresponding docking station 119a-d, such that the individual switches 115a-d are activated, causing each of the fans 111a-d to blow cooling air through the passageways 116a-d, into the docking station 119, and over an external portion of at least the docked module 102 (i.e., over the top portion and the heat sink). Further, the high velocity air from the fan 111 can also be blown into or otherwise drawn into the interior area of the module 102 via the module's on-board fans 118a-d, which can increase the efficiency of the interior cooling system within the module 102a-d.

Each of the fans 111a-d and associated passageway 116 provide the high velocity cooling airflow to a selected one of the docking stations 119 when the module 102 is installed. In the illustrated embodiment, adjacent docking stations are not physically separated from each other within the chassis' interior area. Airflow from one of the fans 111 and associated passageway 116 can enter the aligned docking station (i.e., a first docking station), but also flows along or partially into the adjacent second docking station. When a second module 102 is installed in the adjacent second docking station, the bottom surface of that second module 102 is immediately adjacent to and exposed to the first docking station and the airflow passing therethrough. Accordingly, when the high velocity air from the first fan 111 and its associated air passageway 116 is directed into the first docking station, the airflow is directed over the first module's top surface and its heatsink. When the second module is installed in the adjacent second docking station, the same cooling air from the first fan 111 flows along the space between the adjacent first and second modules and along the bottom portion of the adjacent second module, thereby providing additional supplemental cooling to the second module 102. The fan 111 and air passageway 116 through the ducting 112 can simultaneously provide supplemental cooling to two or more modules docked in the chassis 101. Because of this, in some embodiments, the individual switches 115a-d can each be configured to activate more than one of the fans 111a so as to provide cooling to multiple of the modules 102a-d. For example, if only a single module 102b is installed within the chassis 101, only the switch 115b may be activated. However, both fans 116b and 116a may be turned on, where fan 111b is configured to provide cooling to the fins 106b while fan 116a is configured to provide cooling to the back surface of the module 102b.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. An electronic communication system, comprising:
   a plurality of electronic modules; and
   a chassis configured to removably receive the plurality of electronic modules, wherein the chassis comprises:
     a control system configured to couple the plurality of electronic modules together;
     a plurality of docking stations, each configured to removably receive a respective one of the plurality of electronic modules, wherein airflow space is provided between adjacent docking stations when electronic modules are docked therein; and
     a cooling assembly, wherein the cooling assembly includes a plurality of fans and ducting, wherein the plurality of fans is configured to blow air through the ducting toward the plurality of electronic modules and through the air flow space to provide cooling to the electronic modules docked in the docking station;
     a plurality of switches operatively coupled to the plurality of fans, wherein—
       each of the plurality of switches is configured to selectively control one of the plurality of fans when a corresponding switch is activated, and
       the switches are each positioned within the chassis such that each of the plurality of electronic modules causes a respective one of the plurality of switches to activate when the electronic module is received by the chassis.

2. The electronic communication system of claim 1 wherein each of the plurality of electronic modules is an off-the shelf module.

3. The electronic communication system of claim 1 wherein the ducting includes a plurality of air passageways and wherein each of the plurality of fans is positioned to blow the air into one of the plurality of air passageways and wherein each of the plurality of air passageways is configured to direct the air toward at least one of the plurality of electronic modules.

4. The electronic communication system of claim 3 wherein each of the plurality of air passageways are fluidly isolated from each other.

5. The electronic communication system of claim 3 wherein each of the electronic modules includes a heat sink and wherein each of the air passageways is configured to direct the air toward the heat sink of at least one of the electronic modules.

6. The electronic communication system of claim 5 wherein individual of the electronic modules includes an on-board fan configured to help direct the air over the fins of the individual electronic modules.

7. The electronic communication system of claim 1 wherein each of the electronic modules includes a heat sink and wherein the ducting is configured to direct the air toward the heat sink of the electronic module docked in the docking station.

8. An electronic communication system, comprising:
a plurality of electronic modules comprising a first module and a second module; and
a chassis configured to removably receive the plurality of electronic modules, wherein the chassis comprises:
a control system configured to couple the plurality of electronic modules together;
a plurality of docking stations, each configured to removably receive a respective one of the plurality of electronic modules, wherein airflow space is provided between adjacent docking stations when electronic modules are docked therein; and
a cooling assembly, wherein the cooling assembly includes a plurality of fans and ducting, wherein the plurality of fans is configured to blow air through the ducting toward the plurality of electronic modules and through the air flow space to provide cooling to the electronic modules docked in the docking station, and wherein the plurality of fans comprises a first fan and a second fan, and
wherein the chassis further comprising
a first switch positioned within the chassis and
a second switch positioned within the chassis, wherein—
the first switch is operatively coupled to the first fan and configured to selectively control the first fan,
the second switch is operatively coupled to the second fan and configured to selectively control the second fan,
the first module is configured to activate the first switch without activating the second switch when the first module is installed in the chassis, and
the second module is configured to activate the second switch without activate the first switch when the second module is installed in the chassis.

9. The electronic communication system of claim 8 wherein, when the first module is installed within the chassis while the second module is not installed in the chassis, the first fan is configured to blow air through the ducting while the second fan is off.

10. A portable electronic system, comprising:
a first electronic module;
a second electronic module; and
a portable chassis having a first docking station configured to removably receive the first electronic module and a second docking station configured to removably receive the second electronic module, the chassis further comprising:
a cooling assembly, comprising:
ducting having a first air passageway and a second air passageway;
a first fan coupled to the ducting, wherein the first fan is configured to blow air through the first air passageway and wherein the first air passageway is configured to direct the air toward the first electronic module;
a second fan coupled to the ducting, wherein the second fan is configured to blow air through the second air passageway and wherein the second air passageway is configured to direct the air toward the second electronic module;
a first switch within the first docking station, wherein the first electronic module is configured to activate the first switch when the first docking station receives the first electronic module; and
a second switch within the second docking station, wherein the second electronic module is configured to activate the second switch when the second docking station receives the second electronic module.

11. The electronic system of claim 10 wherein the first switch is operatively connected to the first fan and configured to cause the first fan to blow air through the first air passageway when the first switch is activated and wherein the second switch is operatively connected to the second fan and configured to cause the second fan to blow air through the second air passageway when the second switch is activated.

12. The electronic system of claim 10 wherein the second fan is configured to not blow air into the second air passageway when the second module is not received within the second docking station.

13. The electronic system of claim 10 wherein—
the first electronic module includes a first heat sink,
the second electronic module includes a second heat sink,
when the first docking station receives the first electronic module, the first air passageway is configured to direct the air from the first fan over the heat sink to provide cooling to the first electronic module, and
when the second docking station receives the second electronic module, the second air passageway is configured to direct the air from the second fain over the second heat sink to provide cooling to the second electronic module.

14. The electronic system of claim 13 wherein, when the first and second electronic modules are received within the respective first and second docking stations, the first and second electronic modules are positioned closely adjacent to each other and wherein the first air passageway is configured to direct at least some of the air from the first fan between the first and second electronic modules and toward at least a portion of the second electronic module to provide cooling to the second electronic module.

15. The electronic system of claim 10, wherein—
the electronic system includes a third electronic module and a fourth electronic module,
the chassis includes a third docking station configured to receive the third electronic module and a fourth docking station configured to receive the fourth electronic module,
the cooling assembly includes a third and fourth fans coupled to the ducting, the ducting includes a third air passageway and a fourth air passageway, and the third fan is configured to blow air through the third air passageway, which is configured to direct the air toward the third electronic module, and the fourth fan is configured to blow air through the fourth air passageway, which is configured to direct the air toward the fourth electronic module.

16. A chassis configured to removably receive a plurality of electronic modules, the chassis comprising:
- a plurality of docking stations, wherein each of the plurality of docking stations is configured to removably receive one of the plurality of electronic modules;
- a cooling apparatus configured to provide cooling to each of the received electronic modules, wherein the cooling apparatus comprises:
  - ducting having a plurality of air passageways,
  - a plurality of cooling fans, wherein each of the cooling fans is at least partially positioned within and configured to blow air into one of the air passageways, wherein the ducting is configured such that each of the plurality of air passageways corresponds to one of the plurality of docking stations and is configured to direct the air blown into the air passageway toward the electronic module received by the corresponding docking station; and
- a plurality of switches, wherein each of the plurality of switches is positioned within one of the docking stations and is operatively connected to the fan positioned within the air passageway that corresponds to the docking station and wherein the switch is configured to be switched into an on position when the corresponding docking station receives one of the plurality of electronic modules.

17. The chassis of claim 16 wherein the chassis is configured to provide power to each of the received electronic modules and to facilitate data exchange between each of the electronic received modules.

* * * * *